United States Patent
Petersen et al.

(10) Patent No.: US 8,197,889 B2
(45) Date of Patent: Jun. 12, 2012

(54) METAL NANOWIRES WITH AN OXIDE SHEATH AND PRODUCTION METHOD FOR SAME

(75) Inventors: Christian Petersen, Saarbruecken (DE); Eve Awa Sow, Saarbruecken (DE); Michael Veith, St.-Ingbert (DE)

(73) Assignee: Leibniz-Institut fuer Neue Materialien Gemeinnuetzige GmbH, Saarbruecken (DE)

( * ) Notice: Subject to any disclaimer, the term of this patent is extended or adjusted under 35 U.S.C. 154(b) by 635 days.

(21) Appl. No.: 12/225,109

(22) PCT Filed: Mar. 22, 2007

(86) PCT No.: PCT/EP2007/002564
§ 371 (c)(1),
(2), (4) Date: Dec. 8, 2008

(87) PCT Pub. No.: WO2008/011920
PCT Pub. Date: Jan. 31, 2008

(65) Prior Publication Data
US 2009/0233349 A1 Sep. 17, 2009

(30) Foreign Application Priority Data
Mar. 23, 2006 (DE) .................. 10 2006 013 484

(51) Int. Cl.
*B01D 5/12* (2006.01)
(52) U.S. Cl. ............... 427/126.3; 427/126.4; 977/891
(58) Field of Classification Search ........... 427/126.3, 427/126.4; 977/891
See application file for complete search history.

(56) References Cited

U.S. PATENT DOCUMENTS

| 2003/0144553 A1 | 7/2003 | Vanoppen et al. |
| 2006/0100462 A1 | 5/2006 | Vanoppen et al. |

FOREIGN PATENT DOCUMENTS

| CN | 1 626 300 | | 6/2005 |
| DE | 42 21 659 | | 1/1994 |
| DE | 195 29 241 | | 2/1997 |
| DE | 19529241 A1 | * | 2/1997 |
| WO | 02/02233 | | 1/2002 |

OTHER PUBLICATIONS

J. Hu et al., Synthesis of Gallium-Filled Gallium Oxide-Zinc Oxide Composite Coaxial Nanotubes, 15 Adv. Mater. 1000-1003 (2003).*
Zhang et al, "Germanium Nanowires Sheathed with an Oxide Layer," Physical Review B, vol. 61, No. 7, pp. 4518-4521, 2000.
English language abstract of CN 1 626 300, (2005).
Martin, "Nanomaterials: A Membrane-Based Synthetic Approach," Science, vol. 266, pp. Wu et al., "Direct Observation a Vapor-Liquid-Solid Nanowire Growth," The Journal of the American Chemical Society, vol. 123, pp. 3165-3166, 1961-1966, 1994.
Xia et al., "One-Dimensional Nanostructares: Synthesis, Characterization, and Applications," Advanced Materials, vol. 15, No. 5, pp. 353-389, 2003.
English language Abstract of DE 42 21 659, (1994).
Veith et al., "(*tert*-Butoxy)aluminum and -gallium Hydrides;" Chemische Berichte, vol. 129, pp. 381-384, 1996.
Wu et al., "Direct Observation of Vapor-Liquid-Solid Nanowire Growth," The Journal of the American Chemical Society, vol. 123, pp. 3165-3166, 2001.

* cited by examiner

*Primary Examiner* — Randy Boyer
(74) *Attorney, Agent, or Firm* — Abel Law Group, LLP

(57) ABSTRACT

A one-dimensional composite structure which comprises at least one nanowire. The nanowire comprises a metal core and a metal oxide sheath.

30 Claims, 1 Drawing Sheet

METAL NANOWIRES WITH AN OXIDE SHEATH AND PRODUCTION METHOD FOR SAME

BACKGROUND OF THE INVENTION

1. Field of the Invention

The invention relates to one-dimensional nanowires comprising a metallic core and sheathed with a metal oxide, in particular a ceramic material, and branched nanostructures constructed from aforementioned sheathed nanowires, a method for producing them and their use.

2. Discussion of Background Information

In the context of general miniaturization, primarily in the field of electronic components, the properties of the materials used change the further one advances into the submicron range. Hitherto use has been made principally of nanoparticles having dimensions in the nanometer range in all three spatial directions (so-called 0-dimensional structures), and of thin layers having a dimension in the nanometer range in one spatial direction (so-called 2-dimensional structures).

Primarily as a result of the miniaturization of electronic components, but also as a result of the miniaturization in other fields, there is increasingly also a need for fibers or wires, branched wires, cables and networks thereof in the submicron range (so-called 1-dimensional structures).

Previous methods for producing such one-dimensional structures principally consist in using noble metal catalysts or using templates. Wu et al., J. Am. Chem. Soc., 2001: 123: 3165-3166, describe, e.g. the production of Ge nanowires, wherein gold nanoclusters are used as catalysts. A template-controlled method is described e.g. by Martin, Science 1994; 266:1961-1966. What is disadvantageous about all these methods is that they require the use of foreign materials, such as catalysts or templates, which lead to contaminations of the corresponding structures.

An overview of nanowires and their production is found in Xia et al., Adv. Mater. 2003, 15, No. 5, pp. 353-389. The studies according to the prior art are often directed toward nanowires composed of one material. However, a combination of different properties is often required for use e.g. as miniature components. In general this can be achieved only by means of composite structures, that is to say structures constructed from a combination of two or more materials.

SUMMARY OF THE INVENTION

It is an object of the present invention to provide one-dimensional composite structures which comprise a combination of different materials, such that different properties can be combined. Furthermore, the intention is to provide one-dimensional composite structures which are as free as possible of contaminants, in particular residues of catalysts or templates.

The object has surprisingly been able to be achieved by providing linear or branched nanowires comprising a metallic core sheathed with a metal oxide, in particular a ceramic material. These nanowires can be produced using volatile metallo-organic compounds without using foreign substances. This allows them to be produced under economic conditions and with a high yield.

The invention therefore relates to a one-dimensional composite structure which comprises at least one nanowire comprising a metallic core sheathed with a metal oxide, or at least one branched structure constructed from such nanowires. The invention furthermore relates to a method for producing one-dimensional composite structures and to the use of these structures, as defined in the claims. The structures according to the invention comprise a metallic core and a metal oxide sheath, in particular a ceramic sheath, and can therefore also be referred to as cables.

Specifically, the present invention provides a one-dimensional composite structure. The structure comprises at least one nanowire comprising a metal core and a metal oxide sheath.

In one aspect, the structure may be branched and may comprise a plurality of nanowires which comprise a metal core and a metal oxide sheath.

In another aspect, the metal oxide sheath may comprise a ceramic material and/or the metal core may comprise a metal from main group III and/or the metal oxide sheath may comprise a metal from main group III.

In yet another aspect of the structure, the metal oxide sheath and the metal core may comprise the same metal from main group III. For example, the metal oxide sheath may comprise aluminum oxide and the metal core may comprise aluminum, or the metal oxide sheath may comprise gallium oxide and the metal core may comprise gallium.

In a still further aspect of the structure, the nanowire may have two dimensions in the range of from 10 nm to 100 nm.

In another aspect, the structure may be situated on a substrate.

The present invention also provides a method for producing the structure of the present invention (including the various aspects thereof as set forth above). The method comprises a thermolytic decomposition of at least one metallo-organic compound of formula

$$El(OR)H_2$$

wherein El represents Al, Ga, In or Tl and R represents an aliphatic or alicyclic hydrocarbon radical, at a temperature of more than 400° C.

In one aspect of the method, El may represent Al or Ga. For example, the metallo-organic compound may comprise aluminum tert-butoxydihydride or gallium tert-butoxydihydride.

In another aspect of the method, the thermolytic decomposition may take place on or at a substrate. By way of non-limiting example, the substrate may comprise a semiconducting material and/or a nonconductive material.

In yet another aspect of the method, the thermolytic decomposition may take place at an electrically conductive, inductively heated substrate, at a surface situated in a furnace or at a surface situated on an inductively heated, electrically conductive substrate holder. For example, the electrically conductive, inductively heated substrate may comprise a metal.

In a still further aspect of the method of the present invention, the thermolytic decomposition may be carried out in the absence of a catalyst and a template.

In another aspect, the metallo-organic compound may be decomposed in a gas stream under a pressure of from $10^{-6}$ to 1 mbar and at a temperature of from 450° C. to 1200° C.

In another aspect, the morphological fashioning of the structure may be controlled by varying one or more process parameters selected from substrate temperature, gas pressure, precursor feed temperature, and precursor flow.

In another aspect, the method may further comprise detaching the structure from a substrate.

The present invention also provides an electronic, optical or magnetic component or material, a sensor for detecting low concentrations of biological or chemical species, and a device for influencing and controlling cells in biological systems, all of which comprise the structure of the present invention (including the various aspects thereof as set forth above).

The present invention also provides a method of producing self-cleaning surfaces. The method comprises using the structure of the present invention (including the various aspects thereof as set forth above).

DETAILED DESCRIPTION OF THE INVENTION

Figure 1:
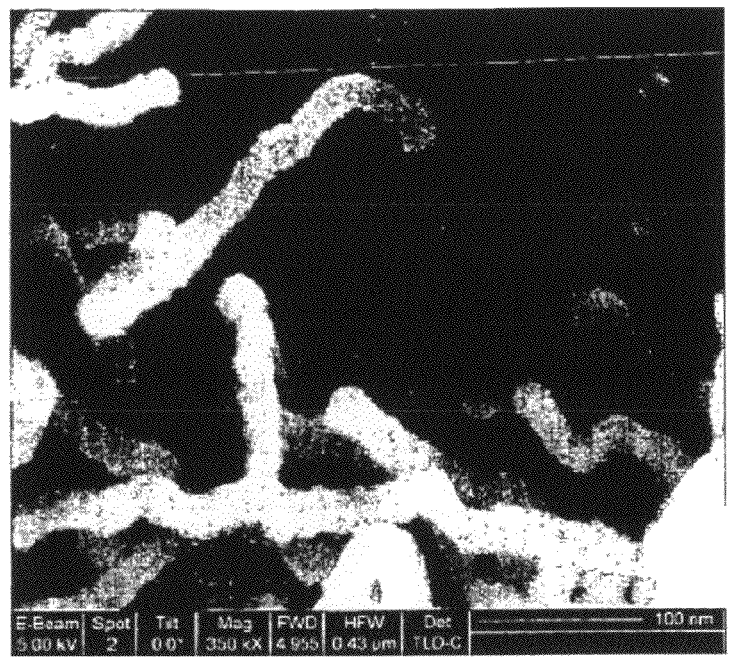
FIG. 1 shows an SEM micrograph of the structures according to the invention.

The nanowire comprises a metallic core sheathed by a metal oxide. The metallic core is composed of a metal, in particular a metal from main group III. Examples are Al, Ga, In and Tl, where aluminum and gallium are particularly preferred. The sheath is composed of a metal oxide, and in particular a metal oxide of a metal from main group III, such as Al, Ga, In and Tl, where an aluminum oxide and a gallium oxide are particularly preferred. In one preferred embodiment, both the metal of the core and the metal of the metal oxide are a metal from main group III, wherein the metal of the core and the metal of the metal oxide are particularly preferably the same metal from main group III.

The metal oxide can be any customary oxide. It encompasses oxides in all customary oxidation states of the metals and also mixed oxides which contain the metal in different oxidation states. The oxides can be present in amorphous fashion or preferably in crystalline fashion. The oxides encompass all customary crystal forms. Examples are α-Al$_2$O$_3$, γ-Al$_2$O$_3$, α-Ga$_2$O$_3$, β-Ga$_2$O$_3$ and In$_2$O$_3$. The metal oxide is preferably a ceramic or a ceramic material.

If appropriate, core and/or sheath can contain small amounts of contaminants, e.g. intermediate products or byproducts from the starting compounds. However, the composite structures are preferably substantially free of contaminants. In particular, they do not contain any residues originating from catalysts or template materials.

The one-dimensional composite structure is a composite comprising a metallic core and a metal oxide sheath. The one-dimensional composite structure can comprise or consist of one or more nanowires of the construction described. Alongside these simple, linear, cable-like one-dimensional structures, the one-dimensional composite structure can alternatively or additionally comprise or consist of one or more branched structures constructed from a plurality of nanowires of the linear form that are grown on one another in ramified fashion. These two forms can also be referred to as linear and branched nanowires. In the case of the branched form, the metallic cores of the wires can touch one another at the branchings or the metal cores can be separated from one another by the metal oxide sheath at the branchings. The one-dimensional composite structure can be present freely or be situated on a substrate.

The nanowires according to the invention have, in particular, two dimensions lying in the range below 200 nm, e.g. in the range of 1 to 200 nm and preferably 10 to 100 nm, in particular approximately 20 to 40 nm. The ratio of width to length of the nanowires is generally at least 1:3 and preferably at least 1:5. The third dimension is generally in the micrometer and submicron range. The cross section of the nanowires is generally approximately circular.

Metallo-organic compounds serve as precursors for other materials in specific fields. Thus, volatile precursors can be converted into thin layers of ceramic materials with very high quality with the aid of the so-called "Metal Organic Chemical Vapor Deposition" method (MO-CVD). The MO-CVD method consists in chemical vapor deposition of metallo-organic compounds. The MO-CVD method requires a sufficient volatility of the precursor under reaction conditions, but conversely the process control requires a certain stability of this compound under normal conditions. Corresponding precursors for producing planar micro- and nanocomposites are known e.g. from DE-A-4221659.

In the method according to the invention, one-dimensional composite structures are obtained by means of an MO-CVD method. For this purpose, a metallo-organic compound is thermolytically decomposed with the formation of the structure. This is a catalyst-free and template-free method. The metallo-organic compounds used have the following general formula:

El(OR)H$_2$ wherein El denotes Al, Ga, In or Tl, where Al and Ga are preferred, and R represents an aliphatic or alicyclic hydrocarbon radical.

The aliphatic or alicyclic hydrocarbon radical is preferably unsaturated. It can have, e.g. 1 to 15 carbon atoms. Alkyl or unsubstituted or alkyl-substituted cycloalkyl are preferred, the alkyl radical preferably has 2 to 12 carbon atoms, preferably 3 to 10 carbon atoms. The alkyl can be linear or branched, where branched alkyl radicals are preferred. Examples are ethyl, n-propyl, n-butyl and the corresponding higher linear homologs, isopropyl, sec-butyl, tert-butyl, neopentyl, neohexyl and the corresponding higher isoalkyl or neoalkyl homologs or 2-ethylhexyl. The alicyclic radicals can comprise one, two or more rings, each of which can be substituted by alkyl. The alicyclic radical preferably comprises 5 to 10, and in particular 5 to 8, carbon atoms. Examples of suitable cycloalkyls are cyclopentyl, cyclohexyl, methylcyclohexyl, norbornyl and adamantyl.

Particularly suitable are aluminumalkoxydihydrides having branched C$_4$-C$_8$ alkoxy radicals, in particular aluminum tert-butoxydihydride. The preparation of compounds of the general formula El(OR)H$_2$ is known and is described in DE-A-19529241. They can be obtained, e.g. by reacting the El hydride with the corresponding alcohol in a molar ratio of 1:1, wherein the El hydride can be prepared in situ by reacting an alkali metal El hydride with El halide. Compounds of the formula El(OR)H$_2$ wherein El is Al or Ga, and their preparation are also described in M. Veith et al., Chem. Ber. 1996, 129, 381-384. This article also shows that the compounds of the formula El(OR)H$_2$ can also comprise dimeric structures.

The metallo-organic compounds are converted into the gas phase and thermolytically decomposed, wherein the nonvolatile decomposition product is generally formed at or on a substrate in the form of the one-dimensional composite structure. Appropriate substrates include, in principle all customary materials, e.g. glass, ceramic, metal, silicon or quartz which are preferably inert with respect to the starting and end products. The thermolysis can be carried out e.g. in a furnace, at an inductively heated surface or at a surface situated on an inductively heated sample carrier. Only electrically conductive materials, such as graphite or metals, are appropriate as substrate materials for direct inductive heating. When using substrates having a relatively low electrical conductivity, such as glass, quartz, silicon, aluminum oxide, it is necessary to use a furnace or, in the case of inductive heating, an electrically conductive substrate carrier, e.g. composed of graphite or metal. The substrate therefore can be a surface of the reaction space or a substrate positioned therein, e.g. a lamina or a film.

The reactor space used can have any desired configuration. By way of example, a reaction tube can be involved. Any customary inert material can be used as reactor material, e.g. Duran or quartz glass. The reactor used for carrying out the method should be adapted to the respective substrate or the dimensions of the substrate. By way of example, a reactor diameter of 5 cm can be used for a round substrate having a diameter of 2.5 cm and a reactor diameter of 55 cm can be used for a substrate having a diameter of 50 cm.

The production of the one-dimensional structures according to the invention essentially depends on the temperature used for the thermolytic decomposition and hence on the substrate temperature. The desired structures arise at elevated temperatures of more than 400° C., preferably at temperatures of at least 450° C. Preferably, temperatures of not more than 1200° C., and in particular not more than 600° C., e.g. from 400° C. to 1200° C., and preferably from 450° C. to 650° C., most preferably from 450° C. to 600° C., are used. The substrate on or at which the thermolysis takes place is accordingly heated to the desired temperature. In this case, the production of the structures according to the invention is independent of the substrate material used and the constitution thereof.

The metallo-organic compound or the precursor can be introduced into the reactor from a supply vessel, which is preferably temperature-regulated to a desired evaporation temperature. The supply vessel can be temperature-regulated e.g. to an evaporation temperature in the range of −50° C. to 120° C., preferably −10° C. to 40° C. The thermolysis in the reactor space is generally effected at atmospheric pressure or reduced pressure, preferably at a vacuum of from generally $10^{-6}$ mbar to atmospheric pressure and more preferably in the range of $10^{-2}$ mbar to $10^{-1}$ mbar. In order to generate a vacuum, a vacuum pump system can be connected to the reactor on the outlet side. All customary vacuum pumps can be used; a combination of rotary vane pump and turbomolecular pump or a rotary vane pump is preferred. It is expedient for the supply vessel for the precursor to be fitted on one side of the reactor space and the vacuum pump system on the other side.

Before the method is carried out, the reactor space can be rendered inert by inert gas, such as nitrogen or argon, being flushed through once or multiply, if appropriate with interim application of a vacuum. After the desired conditions have been set, the precursor is introduced into the reactor over a certain period of time, such that it is thermolytically decomposed at or on the substrate with the formation of the one-dimensional composite structure.

When the substrate is heated by induction, e.g. electrically conductive metal laminae or films having a size measured in square centimeters can be arranged as substrate in a reaction tube composed of Duran or quartz glass. The supply vessel with the precursor, temperature regulated to the desired evaporation temperature, is connected to the reaction tube on the inlet side and a vacuum pump system is connected to said reaction tube on the outlet side. The reaction tube is situated in a radiofrequency induction field that is used to heat the substrate laminae or films to the desired temperature. After the desired pressure has been set and the precursor has been introduced, the substrate is covered with the one-dimensional structures.

The precise morphological fashioning of the one-dimensional composite structures according to the invention can be controlled by suitable selection of the parameter of the method. Length, thickness and/or branching of the structures can be influenced by a targeted choice of substrate temperature and precursor flow (amount of precursor introduced per unit time), which can in turn be controlled by the targeted setting of the precursor feed temperature and the choice of pressure in the reactor.

If the one-dimensional structures, in particular the one-dimensional nanostructures, are intended to be used independently of the substrate, then the structures produced on a substrate can be scraped or detached from the substrate and correspondingly used further.

The morphology and the advantages of the composite material of the structures according to the invention can be utilized in many areas of application. Since the metallic core is electrically conductive and the sheath composed of metal oxide represents an electrical insulator, the structures are outstandingly suitable as nanoscale electrical cables. Electrically conductive nanowires and networks insulated by ceramic sheathing thus afford numerous applications in nanoelectronics. In particular they are suitable for nanoelectronics optical or magnetic components or materials, such as e.g. catalysts.

In particular, they can be used, e.g. as sensors for low concentrations of biological or chemical species. If appropriate, reactions of biological cells or in microreactors can be initiated and controlled by the use of the structures according to the invention. Self-cleaning surfaces can be formed by means of a suitable morphology, e.g. by forming a surface morphology that brings about the so-called "lotus effect".

The invention is explained in more detail below on the basis of an exemplary embodiment, but the latter is not intended in any way to restrict the scope of the invention.

EXAMPLE

A silicon wafer piece of 1×1 cm$^2$ was coated in an apparatus comprising a glass tube having a cylindrical cross section (diameter 4 cm, length approximately 50 cm). A vacuum pump system (rotary vane pump and pressure measuring device) is connected on one side of the tube. A supply vessel filled with the precursor aluminum tert-butoxydihydride is connected on the opposite side of the glass tube. The heating was effected inductively via a copper winding around the reaction tube. A graphite block serves as a support for the silicon wafer piece on to which the precursor is to be deposited. In this arrangement, the temperature was monitored by means of a thermoelement. In the experiment, the graphite block is heated to 600° C. Aluminum tert-butoxydihydride was transferred into the reaction space at 0° C. from the supply vessel for 30 min and decomposed in said reaction space with the formation of aluminum-aluminum oxide nanocables having a length of hundreds of nm and having a diameter of approximately 30 nm.

Scanning electron microscopy (SEM) and atomic force microscopy were carried out in order to characterize the nanocables deposited on a silicon wafer. FIG. 1 shows an SEM micrograph of the structure according to the invention, showing the one-dimensional structure of the material formed.

Figure 2:
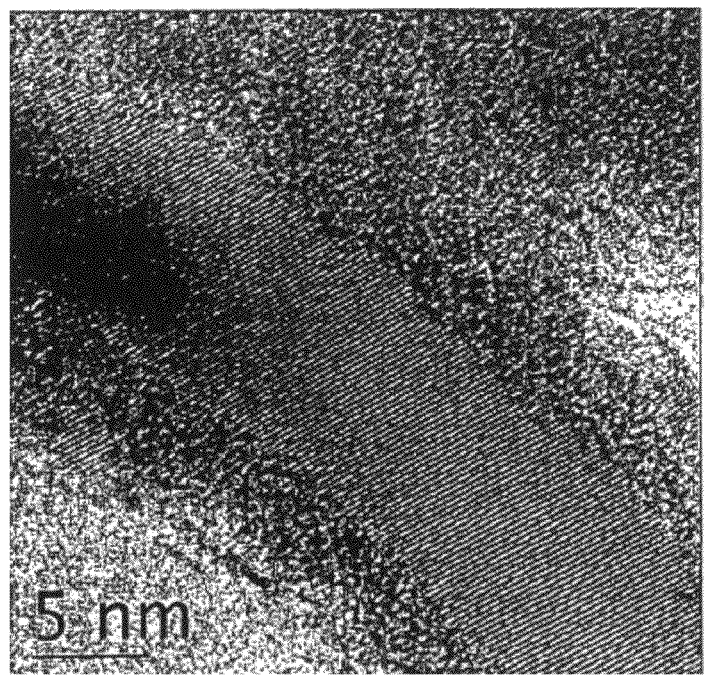
FIG. 2 shows a TEM micrograph revealing the composition structure comprising sheath and core.

An element ratio Al:O of 1:1 was ascertained by electron dispersive X-ray analysis. The presence of metallic (elemental) aluminum was detected by means of X-ray diffraction. The construction of the nanowires formed comprising metallic core and ceramic sheath was detected by transmission electron microscopy (TEM). FIG. 2 shows a TEM micrograph with the structure according to the invention comprising metal core and ceramic sheath.

What is claimed is:

1. A method for producing a one-dimensional composite structure that comprises at least one nanowire comprising a metal core and a metal oxide sheath, wherein the method comprises a thermolytic decomposition of at least one metallo-organic compound of formula $$El(OR)H_2$$

wherein El represents Al, Ga, In or Tl and R represents an aliphatic or alicyclic hydrocarbon radical, in a gas stream under a pressure of from $10^{-6}$ to 1 mbar and at a temperature of from 450° C. to 1200° C., thereby forming the structure.

2. The method of claim 1, wherein El represents Al or Ga.

3. The method of claim 1, wherein the metallo-organic compound comprises aluminum tert-butoxydihydride or gallium tert-butoxydihydride.

4. The method of claim 1, wherein the thermolytic decomposition takes place on or at a substrate.

5. The method of claim 4, wherein the substrate comprises at least one of a semiconducting material and a nonconductive material.

6. The method of claim 1, wherein the thermolytic decomposition takes place at an electrically conductive, inductively heated substrate, at a surface situated in a furnace or at a surface situated on an inductively heated, electrically conductive substrate holder.

7. The method of claim 6, wherein the electrically conductive, inductively heated substrate comprises a metal.

8. The method of claim 1, wherein the thermolytic decomposition is carried out in the absence of a catalyst and a template.

9. The method of claim 1, wherein a morphological fashioning of the structure is controlled by varying one or more process parameters selected from substrate temperature, gas pressure, precursor feed temperature, and precursor flow.

10. The method of claim 4, wherein the method further comprises detaching the structure from the substrate.

11. A method for producing a one-dimensional composite structure that comprises at least one nanowire comprising a metal core and a metal oxide sheath, wherein the method comprises a thermolytic decomposition of at least one metallo-organic compound of formula $$El(OR)H_2$$

wherein El represents Al, Ga, In or Tl and R represents an aliphatic or alicyclic hydrocarbon radical, at a temperature of more than 400° C., thereby forming the structure, and wherein a morphological fashioning of the structure is controlled by varying one or more process parameters selected from substrate temperature, gas pressure, precursor feed temperature, and precursor flow.

12. The method of claim 11, wherein El represents Al or Ga.

13. The method of claim 11, wherein the metallo-organic compound comprises aluminum tert-butoxydihydride or gallium tert-butoxydihydride.

14. The method of claim 11, wherein the thermolytic decomposition takes place on or at a substrate.

15. The method of claim 14, wherein the substrate comprises at least one of a semiconducting material and a nonconductive material.

16. The method of claim 11, wherein the thermolytic decomposition takes place at an electrically conductive, inductively heated substrate, at a surface situated in a furnace or at a surface situated on an inductively heated, electrically conductive substrate holder.

17. The method of claim 16, wherein the electrically conductive, inductively heated substrate comprises a metal.

18. The method of claim 11, wherein the thermolytic decomposition is carried out in the absence of a catalyst and a template.

19. The method of claim 14, wherein the method further comprises detaching the structure from the substrate.

20. A method for producing a one-dimensional composite structure that comprises at least one nanowire comprising a metal core and a metal oxide sheath, wherein the method comprises a thermolytic decomposition of at least one metallo-organic compound of formula $$El(OR)H_2$$

wherein El represents Al, Ga, In or Tl and R represents an aliphatic or alicyclic hydrocarbon radical, on or at a substrate and at a temperature of more than 400° C., thereby forming the structure, and a detaching of the formed structure from the substrate.

21. The method of claim 20, wherein El represents Al or Ga.

22. The method of claim 20, wherein the metallo-organic compound comprises aluminum tert-butoxydihydride or gallium tert-butoxydihydride.

23. The method of claim 20, wherein the substrate comprises at least one of a semiconducting material and a nonconductive material.

24. The method of claim 20, wherein the thermolytic decomposition takes place at an electrically conductive, inductively heated substrate, at a surface situated in a furnace or at a surface situated on an inductively heated, electrically conductive substrate holder.

25. The method of claim 24, wherein the electrically conductive, inductively heated substrate comprises a metal.

26. The method of claim 20, wherein the thermolytic decomposition is carried out in the absence of a catalyst and a template.

27. The method of claim 11, wherein the structure is branched and comprises a plurality of nanowires comprising a metal core and a metal oxide sheath.

28. The method of claim 11, wherein the metal oxide sheath comprises a ceramic material.

29. The method of claim 11, wherein the nanowire has two dimensions in a range of from 10 nm to 100 nm.

30. The method of claim 11, wherein the metal oxide sheath comprises aluminum oxide and the metal core comprises aluminum or the metal oxide sheath comprises gallium oxide and the metal core comprises gallium.

* * * * *